United States Patent
Samsonov (10) Patent No.: US 10,042,025 B2
(45) Date of Patent: Aug. 7, 2018

(54) SYSTEM AND METHOD FOR CHEMICAL SHIFT MAGNETIC RESONANCE IMAGING USING MAGNETIZATION TRANSFER

(71) Applicant: Wisconsin Alumni Research Foundation, Madison, WI (US)

(72) Inventor: Alexey A. Samsonov, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 247 days.

(21) Appl. No.: 15/172,122

(22) Filed: Jun. 2, 2016

(65) Prior Publication Data

US 2017/0350951 A1    Dec. 7, 2017

(51) Int. Cl.

| | | |
|---|---|---|
| *G01V 3/00* | (2006.01) | |
| *G01R 33/485* | (2006.01) | |
| *G01R 33/48* | (2006.01) | |
| *G01R 33/561* | (2006.01) | |
| *G01R 33/565* | (2006.01) | |
| *G01R 33/50* | (2006.01) | |

(52) U.S. Cl.
CPC ....... *G01R 33/485* (2013.01); *G01R 33/4828* (2013.01); *G01R 33/50* (2013.01); *G01R 33/5614* (2013.01); *G01R 33/5615* (2013.01); *G01R 33/56563* (2013.01)

(58) Field of Classification Search
CPC .................. G01R 33/50; G01R 33/485; G01R 33/56563; G01R 33/4828
USPC .................................................. 324/309, 307
See application file for complete search history.

(56) References Cited

U.S. PATENT DOCUMENTS 5,281,917 A * 1/1994 Santyr ................ G01R 33/4828
                                                             324/307
7,924,003 B2   4/2011 Yu et al.
(Continued)

OTHER PUBLICATIONS

Chen, et al., High-Resolution MAS NMR Spectroscopy Detection of the Spin Magnetization Exchange by Cross-Relaxation and Chemical Exchange in Intact Cell Lines and Human Tissue Specimens, Magnetic Resonance in Medicine, 2006, 55:1246-1256.
(Continued)

*Primary Examiner* — Amy He
(74) *Attorney, Agent, or Firm* — Quarles & Brady LLP (57) ABSTRACT

A system and method is provided for producing a map of a static magnetic field ($B_0$) of a magnetic resonance imaging system. The method includes forming a first dataset by acquiring, with the MRI system, a first plurality of different echo signals occurring at a respective plurality of different echo times. The method also includes forming a second dataset by acquiring, with the MRI system, a second plurality of different echo signals occurring at a respective plurality of different echo times. The second dataset includes signals resulting from a magnetization transfer (MT) between free water and bound molecules. The method further includes generating MT-weighted maps using the first dataset and the second dataset, determining, using the MT-weighted maps, a phase difference between the first plurality of different echo signals, and using the phase differences, generate a corrected map of the static magnetic field ($B_0$) of the MRI system.

21 Claims, 5 Drawing Sheets

(56) References Cited

U.S. PATENT DOCUMENTS 8,405,392 B2 3/2013 Chen et al.
2014/0347051 A1* 11/2014 Kecskemeti ....... G01R 33/5602
324/309

OTHER PUBLICATIONS

Chen, et al., Fat-Free MRI Based on Magnetization Exchange, Magnetic Resonance in Medicine, 2010, 63:713-718.

Griswold, et al., Generalized Autocalibrating Partially Parallel Acquisitions (GRAPPA), Magnetic Resonance in Medicine, 2002, 47:1202-1210.

Hernando, et al., Joint Estimation of Water/Fat Images and Field Inhomogeneity Map, Magnetic Resonance in Medicine, 2008, 59:571-580.

Hernando, et al., Addressing Phase Errors in Fat-Water Imaging Using a Mixed Magnitude/Complex Fitting Method, Magnetic Resonance in Medicine, 2012, 67(3):638-644.

Jezzard, et al., Correction for Geometric Distortion in Echo Planar Images from B0 Field Variations, Magnetic Resonance in Medicine, 1995, 34:65-73.

Portnoy, et al., Modeling Pulsed Magnetization Transfer, Magnetic Resonance in Medicine, 2007, 58:144-155.

Pruessmann, et al., SENSE: Sensitivity Encoding for Fast MRI, Magnetic Resonance in Medicine, 1999, 42:952-962.

Reeder, et al., Iterative Decomposition of Water and Fat With Echo Asymmetry and Least-Squares Estimation (IDEAL): Application With Fast Spin-Echo Imaging, Magnetic Resonance in Medicine, 2005, 54:636-644.

Yu, et al., Field Map Estimation with a Region Growing Scheme for Iterative 3-Point Water-Fat Decomposition, Magnetic Resonance in Medicine, 2005, 54:1032-1039.

Yu, et al., Robust Multipoint Water-Fat Separation Using Fat Likelihood Analysis, Magnetic Resonance in Medicine, 2012, 67:1065-1076.

* cited by examiner

SYSTEM AND METHOD FOR CHEMICAL SHIFT MAGNETIC RESONANCE IMAGING USING MAGNETIZATION TRANSFER

STATEMENT REGARDING FEDERALLY SPONSORED RESEARCH

This invention was made with government support under EB018483 awarded by the National Institutes of Health. The government has certain rights in the invention.

BACKGROUND

The present disclosure relates generally to systems and methods for magnetic resonance imaging ("MRI"). More particularly, the disclosure relates to systems and methods for separating signal contributions from two or more chemical species using MRI.

MRI uses the nuclear magnetic resonance ("NMR") phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

Chemical-shift imaging (CSI) is a general approach for separation of multiple spin species in the MRI signal, which explores the differences in spin precession induced by the spin species' chemical shift with respect to the main resonance frequency. CSI methods collect images at multiple echo times, such that the phase shifts between the species can be used to evaluate parametric maps corresponding to each of the species.

One prominent CSI technique is Dixon separation of fat and water (F/W) signals, which explores chemical shift differences between fat and water for either creation of fat-free images or quantification of water and fat contributions to MRI signal. More complex variants of F/W imaging, such as iterative decomposition of water and fat with echo asymmetry and least-squares (IDEAL) model F/W contributions jointly with the magnetic field inhomogeneity through a field map and, for gradient echo sequences, T2* decay.

In these methods, several images are acquired with different echo time ("TE") shifts, typically using a multi-echo spoiled gradient echo ("SPGR") pulse sequence. Subsequently, separated water and fat images are reconstructed, and fat fraction maps are obtained. In order for the resulting fat fraction maps to accurately measure proton density fat fraction, multiple confounding factors in the acquired echo signals need to be addressed. These confounding factors include $B_0$ inhomogeneities, $T_1$ bias, noise bias, $T_2$ decay, spectral complexity of the fat signal, and phase errors, such as those due to eddy currents.

Thus, the presence of confounding factors may impact the robustness and reproducibility of CSI-based techniques. Of particular concern, CSI, in general, and Dixon F/W separation methods, in particular, must contend with inherent uncertainties arising from the competing sources of off-resonance (i.e., fat chemical shift and field inhomogeneity). The associated local minima of the nonlinear objective function, when trapped therein, may lead to significant errors (e.g., swapped fat and water). Several approaches have been proposed to reduce these errors. The majority of algorithms exploit assumptions of field map smoothness, which may fail in cases of significant field inhomogeneities (like in near-metal imaging, tissue-air interfaces, etc.) or when discontinuity between different tissue areas is present (like in imaging of breast and thighs).

It would therefore be desirable to provide a method for chemical species signal separation that is more reliable and reproducible because it can better control the impact of off-resonance effects on the resulting images and/or quantifications.

SUMMARY

The present disclosure overcome the aforementioned drawbacks by providing systems and methods that increase CSI robustness by using a fat-insensitive field map for calibration. More particularly, the present disclose can use the so-called magnetization transfer (MT) effect and its lack of influence on fat to attain fat-insensitive field map calibration that can then be used to improve CSI robustness and techniques related thereto, such as IDEAL.

In accordance with one aspect of the disclosure, a method is provided for producing a map of a static magnetic field ($B_0$) of a magnetic resonance imaging system. The method includes forming a first dataset by acquiring, with the MRI system, a first plurality of different echo signals occurring at a respective plurality of different echo times. The method also includes forming a second dataset by acquiring, with the MRI system, a second plurality of different echo signals occurring at a respective plurality of different echo times. The second dataset includes signals resulting from a magnetization transfer (MT) between free water and bound molecules. The method further includes generating MT-weighted maps using the first dataset and the second dataset, determining, using the MT-weighted maps, a phase difference between the first plurality of different echo signals, and using the phase differences, generate a corrected map of the static magnetic field ($B_0$) of the MRI system.

In accordance with another aspect of the disclosure, a magnetic resonance imaging (MRI) system is provided that includes a magnet system configured to generate a static magnetic field about at least a portion of a subject arranged in the MRI system, a gradient system configured to establish at least one magnetic gradient field with respect to the static magnetic field, and a radio frequency (RF) system configured to deliver excitation pulses to the subject and acquire imaging data from the subject. The MRI system also includes a computer system programmed to control the gradient system and RF system to perform a first pulse sequence to acquire a first plurality of different echo signals occurring at a respective plurality of different echo times and form therefrom a first dataset at a first resolution. The computer system is further programmed to control the gradient system and RF system to perform a second pulse sequence, different from the first pulse sequence and including a magnetization transfer (MT) pulse, to acquire a second plurality of different echo signals occurring at a respective plurality of different echo times and form therefrom a second dataset at a second resolution. The computer system is further programmed to use the first dataset and the second dataset to determine a MT-weighted water map at a selected one or more of the plurality of different echo times. The computer system is also programmed to use the MT-weighted water map to determine phase differences between echoes and use the determined phase differences to determine compensations to offset the phase differences. The computer system is further programmed to correct at least one of the first dataset or the second dataset using the compensations to generate at least one corrected dataset and generate images of the subject using the at least one corrected dataset.

In accordance with yet another aspect of the disclosure, a method is provided for acquiring medical images of a subject using a magnetic resonance imaging (MRI) system having a static magnetic field ($B_0$). The method includes performing a first pulse sequence to acquire a first plurality of different echo signals from the subject occurring at a respective plurality of different echo times and form therefrom a first dataset at a first resolution. The method also includes performing a second pulse sequence, different from the first pulse sequence and including a magnetization transfer (MT) pulse, to acquire a second plurality of different echo signals occurring at a respective plurality of different echo times and form therefrom a second dataset at a second resolution that is lower than the first resolution. The method further includes using the first dataset and the second dataset to determine a MT-weighted water map at a selected one or more of the plurality of different echo times. The method also includes generating a map of the static magnetic field ($B_0$) of the MRI system using the MT-weighted water map and generating chemical-shift imaging (CSI) images from at least one of the first dataset or the second dataset using the map of the static magnetic field ($B_0$).

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
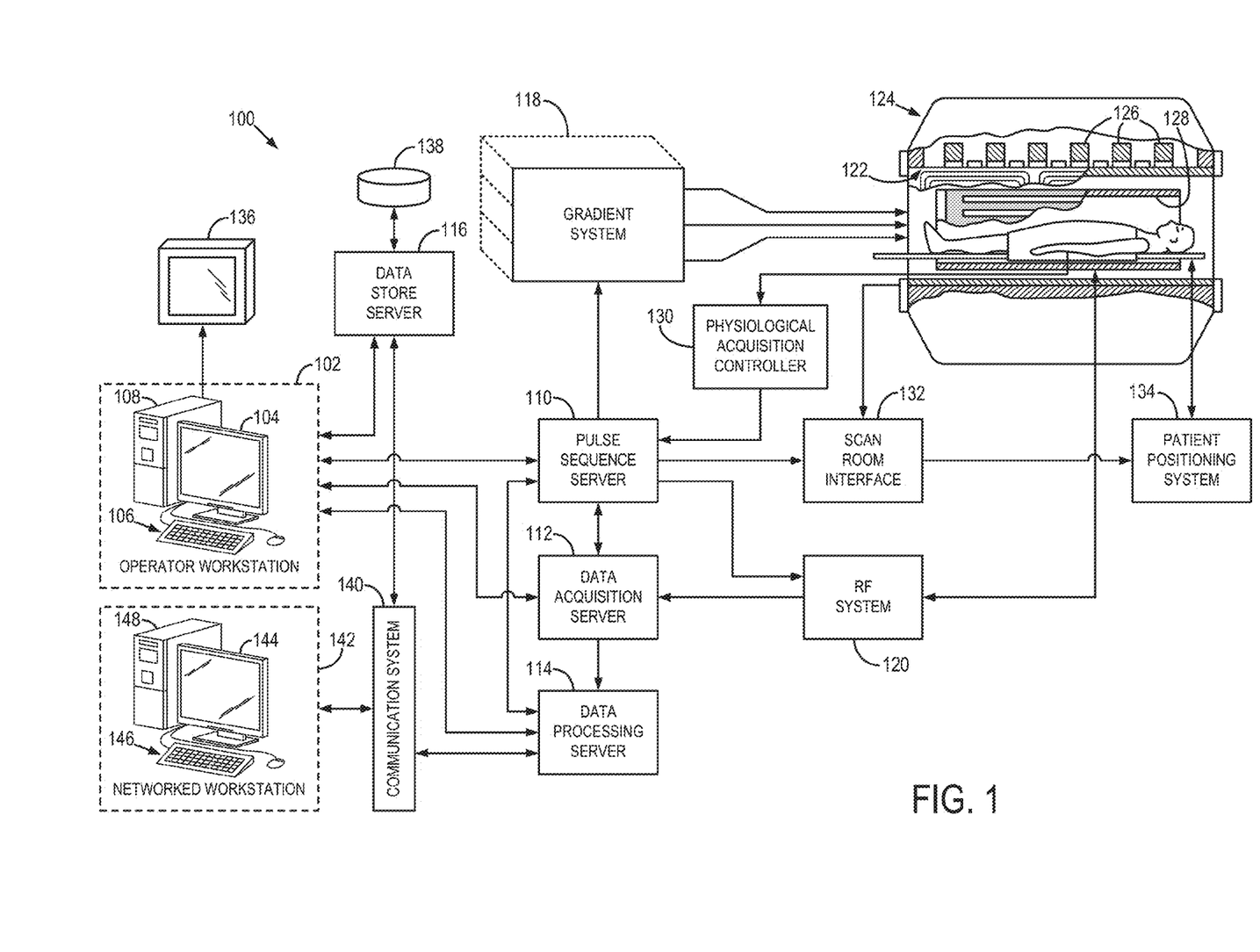
FIG. 1 is a block diagram of an example of a magnetic resonance imaging (MRI) system configured to employ the present disclosure.

Referring particularly to FIG. 1, an example of an MRI system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or a head (and neck) RF coil for brain imaging).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2} \qquad (1),$$

and the phase of the received MR signal may also be determined:

$$\phi=\tan^{-1}(Q/I) \qquad (2).$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
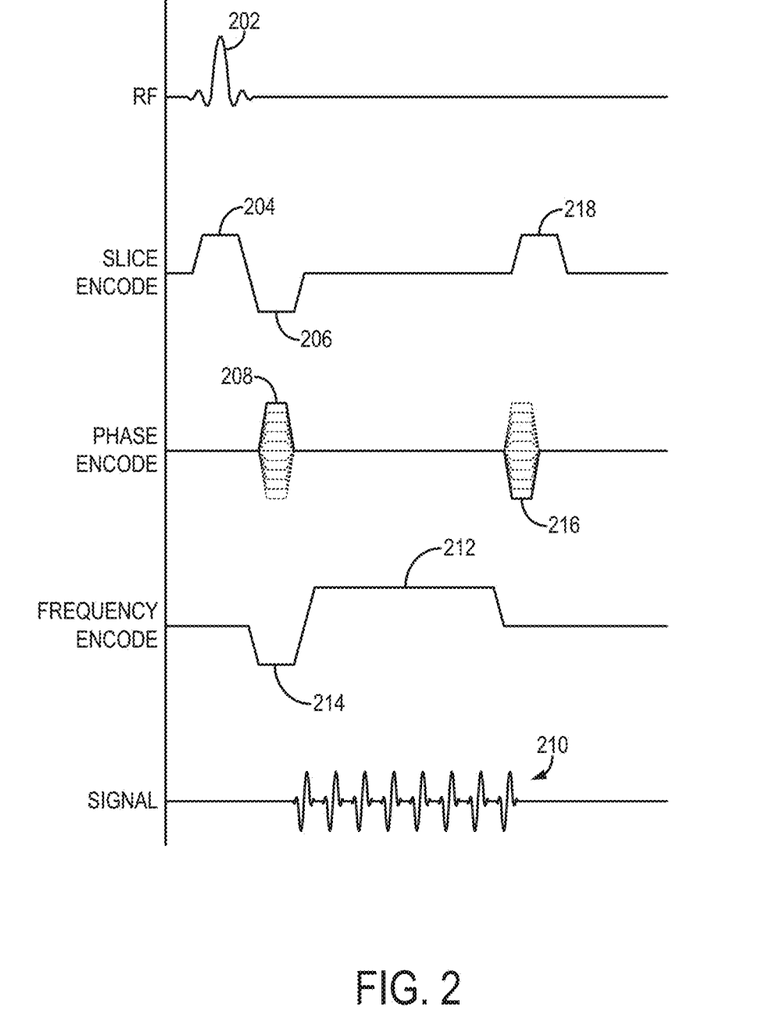
FIG. 2 is a graphic representation of an exemplary spoiled gradient recalled echo ("SPGR") pulse sequence for directing the MRI system of FIG. 1 to acquire image data in accordance with the present disclosure.

An exemplary pulse sequence employed to direct the MRI system to acquire CSI image data is illustrated in FIG. 2. Such an exemplary pulse sequence is commonly referred to as a spoiled gradient recalled echo ("SPGR") pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo-planar imaging ("EPI") sequences, spiral imaging sequences, and radial imaging sequences.

The exemplary SPGR pulse sequence includes a spatially selective radio frequency ("RF") excitation pulse 202 that is repeated at the start of each repetition time ("TR") period. Moreover, the RF excitation pulse 202 is played out in the presence of a slice-selective gradient 204 in order to produce transverse magnetization in a prescribed imaging slice. The slice-selective gradient 204 includes a rephasing lobe 206 that acts to rephase unwanted phase accruals caused by the RF excitation pulse 202. Following excitation of the nuclear spins in the prescribed imaging slice, a phase encoding gradient 208 is applied to spatially encode a nuclear magnetic resonance signal, representative of a series of gradient-recalled echoes 210, along one direction in the prescribed imaging slice. A readout gradient 212 is also applied after a dephasing gradient lobe 214 to spatially encode the signal representative of echo 210 along a second, orthogonal direction in the prescribed imaging slice. The echoes 210 are sampled during a data acquisition window.

A rewinder gradient 216 is played out along the phase-select gradient axis in order to rephase remaining transverse magnetization in preparation for subsequent repetitions of the pulse sequence. As is well known in the art, the pulse sequence is repeated and the amplitude of the phase-encoding gradient 206 and the rewinder gradient 216, which is equal in amplitude and area, but opposite in polarity with respect to the phase-encoding gradient 206, are stepped through a set of values such that k-space is sampled in a prescribed manner. The pulse sequence concludes with the application of a spoiler gradient 218 that spoils the remaining transverse magnetization.

Thus, image data is acquired a plurality of times from each prescribed imaging slice, and the echo time ("TE") is incremented during successive repetitions such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. It is noted that any number of multiple echoes can be acquired when practicing the present disclosure, including only two echoes, in which so-called "2-point Dixon methods" can be employed. In general the more echoes that are acquired, the more reliable the method will be. For example, as the number of echoes acquired is increased, the spectral differences between species becomes more "observable." Additional echoes may be acquired with low spatial resolution in order to minimize additional scan time requirements.

The pulse sequence employed to direct the MRI system to acquire data can be adapted to include magnetization preparation pulses in order to manipulate the spectra of the species being images. For example, non-selective or spectrally selective magnetization preparation pulses can be utilized, such as inversion recovery pulses, $T_2$-prep pulses, fat-sat pulses, and magnetization transfer pulses. Some preparation methods include $T_2$-prep methods; magnetization transfer methods; methods that facilitate J-coupling; methods that exploit differences in $T_1$ or $T_2$ between species, or between peaks within a specific species; velocity encoding; and any such methods that change the appearance of the spectrum of a particular species.

As will be described in detail, the present disclosure uses the magnetization transfer phenomenon to improve CSI processes. However, before turning to the specifics of using the magnetization transfer phenomenon to improve CSI processes, some additional discussion of CSI modeling and techniques is provided.

The signal model for a combined water-fat signal for N echoes acquired at echo times, $t_n$, in which multiple spectral peaks are accounted for in the fat signal, may be expressed as:

$$s_n = \left(\rho_W + \rho_F \sum_{m=1}^{M} \alpha_m e^{i2\pi f_m t_n}\right) e^{-R_2^* t_n} e^{i2\pi f_B t_n}; \quad (3)$$

where $\rho_W$ and $\rho_F$ are the water and fat signal amplitudes, respectively; $f_m$ is the $m^{th}$ frequency value for the M spectral peaks in the fat signal model; $\alpha_m$ is the $m^{th}$ relative spectral peak amplitude value for the M spectral peaks in the fat signal model; $t_n$ is the echo time for the $n^{th}$ acquired echo signal, with $n=1, \ldots, N$; $R_2^*$ is the transverse relaxation rate as affected by magnetic field inhomogeneities, which is equal to $R_2^*=1/T_2^*$; and $f_B$ is the local frequency offset due to $B_0$ field inhomogeneities. The spectral frequencies, $f_m$, of the fat signal are known, as are the relative peak amplitudes, $\alpha_m$, for those spectral peaks. If the relative peak amplitudes, $\alpha_m$, are not know, they can be determined using an auto-calibration technique, such as the one described in U.S. Pat. No. 7,924,003, which is herein incorporated by reference in its entirety. The relative peak amplitudes, $\alpha_m$, are subject to the following relationship:

$$\sum_{m=1}^{M} |\alpha_m| = 1. \quad (4)$$

The model in Eqn. (3) makes the assumption that the transverse relaxation rate $R_2^*$, for water and all of the fat peaks are equal. This approximation introduces low bias and improved noise stability. In the presence of phase errors, the signal model presented in Eqn. (3) is modified as follows:

$$s_{n,acq} = s_n e^{i\phi_n} + \eta_n \quad (5);$$

where $\phi_n$ is the phase error in the $n^{th}$ echo signal and $\eta_n$ is complex Gaussian noise. It is contemplated that for single-shot acquisitions the majority of phase errors will occur primarily in the first echo; that is, $\phi_n=0$ for $n\geq 2$. Using this assumption, a mixed magnitude-complex fitting method can be utilized when separating the relative signal contributions of different chemical species. For example, to determine the relative signal contributions for water and fat using the signal models in Eqns. (3) and (5), the following minimization may be performed:

$$\min_{\rho_W, \rho_F, R_2^*, f_B} \left\{ (|s_1| - |s_{1,acq}|)^2 + \sum_{n=2}^{N} |s_n - s_{n,acq}|^2 \right\}; \quad (6)$$

where the first term in the minimization is related to a nonlinear least-squares problem that seeks the estimates of the variables $\{\rho_W, \rho_F, R_2^*, f_B\}$ that best fit the magnitude of the signal from the first echo, in the least-squares sense; and the second term in the minimization is related to a nonlinear least-squares problem that seeks the estimates of the variables $\{\rho_W, \rho_F, R_2^*, f_B\}$ that best fit the complex-valued signal from the remaining echoes, in the least-squares sense. This approach combines magnitude fitting for the first term, $(|s_1| - |s_{1,acq}|)^2$, and complex fitting for the second term, $$\sum_{n=2}^{N} |s_n - s_{n,acq}|^2,$$

which thereby removes the influence of phase errors from the first echo in the resultant water and fat images. A fat fraction can then be calculated from these water and fat images, in which phase errors are significantly reduced.

The minimization in Eqn. (6) can be generalized to address phase errors that may occur at other echoes than the first echo. There may be instances where significant phase errors occur at various echoes. In these instances, the following generalized minimization may be used:

$$\min_{\rho_W, \rho_F, R_2^*, f_B} \left\{ \sum_u (|s_u| - |s_{u,acq}|)^2 + \sum_v |s_v - s_{v,acq}|^2 \right\}; \quad (7)$$

where the index, u, counts the echo times at which a phase error is recorded and the index, v, counts the echo times at which no phase errors are recorded. For example, if a phase error is recorded at a first and fifth echo time in a data set that includes data sampled at six different echo times, then $u=\{1,5\}$ and $v=\{2,3,4,6\}$.

It should be noted that the aforementioned mixed fitting minimization can also be adapted to fit phase values of selected echoes and to remove other echoes altogether. For instance, if the MRI system encounters an error in which a particular echo becomes corrupted, that echo may be removed altogether. There may be other instances where the phase of an echo is substantially free of errors, but the magnitude may be corrupted or contain errors. For example, where there is severe through-slice $B_0$ field inhomogeneities, dephasing and significant additional signal decay may be present in later acquired echoes. Such a generalized minimization takes the following form:

$$\min_{\rho_W, \rho_F, R_2^*, f_B} \left\{ \begin{array}{l} \sum_q 0 \cdot s_q + \sum_r w_r \cdot (\angle(s_r) - \angle(s_{r,acq}))^2 + \\ \sum_u (|s_u| - |s_{u,acq}|)^2 + \sum_v |s_v - s_{v,acq}|^2 \end{array} \right\}; \quad (8)$$

where the index, q, counts those echo times that are to be discarded in their entirety; the index, r, counts those echo times at which a magnitude error is recorded; $\angle(\ldots)$ is an angle operator, which returns the phase, or angle, value of a complex number; and $w_r$ is a weighting factor that accounts for scaling of the phase values. For example the phase values returned by the angle operator will be in the range of $0$-$2\pi$, whereas the third and fourth terms in Eqn. (8) may be much smaller, such as on the order of $1\times10^{-6}$ or $1\times10^6$. Thus, the weighting factor, $w_r$, can be selected to ensure that the second term and the third and fourth terms remain in a relative balance so that one does not overwhelm the other.

The foregoing minimization problems may be readily modified where the assumption that the $R_2^*$ value for the chemical species are equal does not hold. For example, if the $R_2^*$ value for water and fat are not equal the following signal model can be used to replace the one provided in Eqn. (3):

$$s_n = \left(\rho_W e^{-R_{2,W}^* t_n} + \rho_F \sum_{m=1}^{M} \alpha_m e^{i2\pi f_m t_n} e^{-R_{2,F}^* t_n}\right) e^{i2\pi f_B t_n}; \quad (9)$$

where $R_{2,W}^*$ is the $R_2^*$ value for water, and $R_{2,F}^*$ is the $R_2^*$ for fat. In general, the signal model of Eqn. (3) can be generalized to account for any number of different chemical species as follows:

$$s_n = \left(\sum_J \left(\rho_J \sum_{m,J=1}^{M_J} \alpha_{m,J} e^{i2\pi f_{m,J} t_n} e^{-R_{2,J}^* t_n}\right)\right) e^{i2\pi f_B t_n}; \quad (10)$$

where the index, J, indicates a given chemical species and, therefore, $\rho_J$ is the relative signal contribution for that chemical species, $R_{2,J}^*$ is the $R_2^*$ value for that chemical species, and the index, m, counts the number of spectral peaks, $M_J$, associated with the chemical species. For example, J may indicate one of water, fat, hyperpolarized carbon-13, metabolites containing hyperpolarized carbon-13, hyperpolarized xenon-129, hyperpolarized helium-3, acetone, choline, lactate, and silicone. By way of example, J may indicate water, fat, and silicone, in which case Eqn. (10) may be expressed as:

$$s_n = \left(\rho_W e^{-R_{2,W}^* t_n} + \rho_F \sum_{m,F=1}^{M_F} \alpha_{m,F} e^{i2\pi f_{m,F} t_n} e^{-R_{2,F}^* t_n} + \rho_S \sum_{m,S=1}^{M_S} \alpha_{m,S} e^{i2\pi f_{m,S} t_n} e^{-R_{2,S}^* t_n}\right) e^{i2\pi f_B t_n}; \quad (11)$$

where $\rho_S$ is the silicone signal amplitude; $\alpha_{m,S}$ is the relative spectral peak amplitude for the $m^{th}$ spectral peak in the silicone spectrum; $f_{m,S}$ is the resonance frequency value for the $m^{th}$ spectral peak in the silicone spectrum; and $R_{2,S}^*$ is the $R_2^*$ value for silicone.

As described above, despite the relatively successful performance of most techniques, water-fat swaps still occur. This is especially true in spatial regions where the $B_0$ field varies rapidly because the common assumption of a slowly varying $B_0$ field becomes invalid. Furthermore, images with discontinuous regions of tissue separated by air, implants, or low signal are also prone to water-fat swapping, for example, since region-growing or linear/smoothness methods, or other methods aimed at estimating the $B_0$ field map are unable to interpolate field map estimates accurately across regions of noise.

Separating water and fat requires the estimation of the unknown parameters from the multi-echo measurements. In the presence of complex additive white Gaussian noise ("AWGN"), the maximum likelihood estimate is found by minimizing the least-squares cost. However, because of the complex exponential mapping of the field map, $f_B$, to the acquired signal data $s_n$, the least-squares cost contains multiple local minima as a function of $f_B$. Converging to a local, but not global, minimum may result in a swap of the water and fat signals.

Past works have proposed to overcome the challenge of multiple local minima by constraining the estimate of the $B_0$ field map, $f_B$, to be slowly varying. However, the assumption of a slowly varying $B_0$ field breaks down in regions where the susceptibility distribution changes rapidly, such as at air-tissue interfaces, and in anatomies with irregular geometry, such as the ankle or brachial plexus. Further, assumptions regarding the degree of field map smoothness generally have no physical basis and are chosen empirically rather than based on the anatomy itself.

The $B_0$ field inhomogeneity is composed of disturbances in the magnetic field that are generally caused by the background magnetic field, which is caused by the shim fields and imperfections in the magnet system, and the susceptibility-induced magnetic field, which results from the interaction of the object being imaged with the applied magnetic field. Rapidly varying $B_0$ fields are attributable to the component of the magnetic field that is induced by abrupt changes in the local susceptibility distribution. The susceptibility-induced field, $f_{B,s}$, can be estimated if the susceptibility distribution, $\chi$, of the object is known, $$f_{B,s}(k) = \frac{\gamma}{2\pi} B_0 \left(\frac{1}{3} - \frac{k_z^2}{k^H k}\right) \chi(k); \quad (12)$$

where $\gamma/2\pi$ is the gyromagnetic ratio (i.e., 42.58 MHz/T for $^1$H), $B_0$ is the main magnetic field strength in Tesla, k denotes the k-space location, and $k^H$ is the conjugate transpose of that k-space location. The image domain representation of $f_{B,s}$ can be calculated by inverse Fourier transform of Eqn. (12).

In the context of chemical shift encoding, an estimate of the susceptibility distribution based on anatomy can be used to estimate the susceptibility-induced field, which can then be used as an object-based initial estimate of the $B_0$ inhomogeneity map. If the initial estimate of the susceptibility-induced field is reasonably accurate, it may serve as a good initialization for current water-fat separation techniques. An approximation of these susceptibility-induced field inhomogeneities, $f_{B,s}$, can be derived using the source images reconstructed from data acquired at different echo times. This estimate of the susceptibility-induced field, $f_{B,s}$, can then be used to initialize any complex-based water-fat separation, or other chemical species separation, technique.

However, any estimate of the susceptibility distribution based on anatomy is inherently limited by the accuracy of the information about the anatomy. Unfortunately, MRI-acquired data can be rendered inaccurate for any of a variety of reasons, even beyond those outlined above. With each additional strategy to address confounding factors, the individual errors around each confounding factor can compound to render the end result inaccurate. However, the present disclosure provides systems and methods to derive an accurate field map without fat interference. As such, substantial confounding factors can be removed or reduced and CSI data is improved.

Off-resonance MT saturation does not have a detectable effect on the fat signal when applied far from on-resonance (e.g., offset frequency $\Delta > 2.5$ kHz). This insensitivity is due to absence of efficient physical mechanisms to transfer magnetization from fat to either water or tissue macromolecular (protein/membrane phospholipid) protons. Simultaneously, an MT saturation pulse attenuates water via magnetization exchange between saturated tissue macromolecules and water protons.

Figure 3:
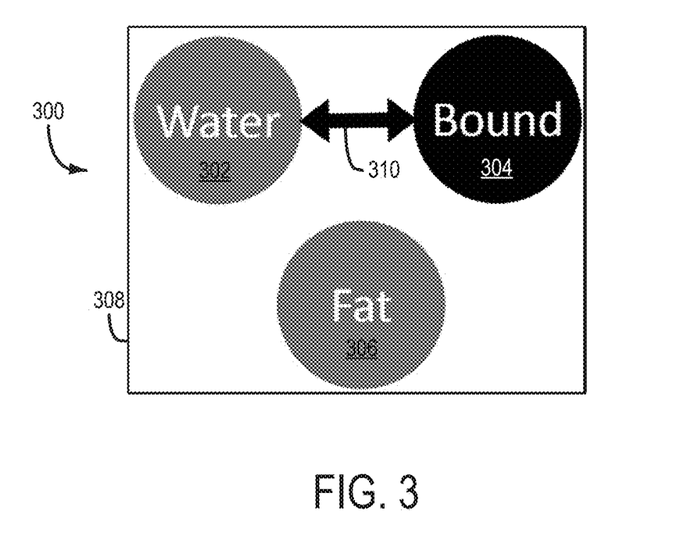
FIG. 3 is a graphic illustration of a model of a voxel in accordance with the present disclosure.

Conceptually, the signals can be represented by a model of a three proton pool 300, as illustrated in FIG. 3. Three pool model 300 represents interaction of water 302, bound macromolecules 304, and fat 306 in a given voxel 308. As illustrated and well documented, there is a magnetization exchange pathway 310 between the water 302 and the bound molecules 304. However, there is no magnetization exchange pathway with fat 306. That is, MT saturation will affect only water 302 in the tissue.

Figure 4:
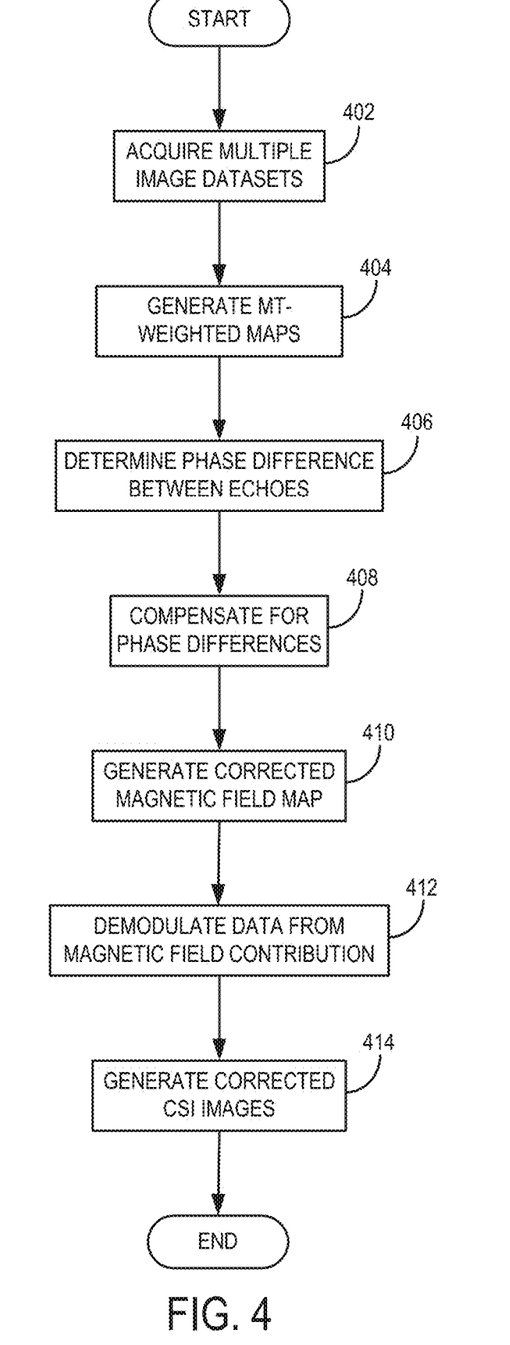
FIG. 4 is a flowchart setting forth the steps of an exemplary method for separating the relative signal contributions of different chemical species in accordance with the present disclosure.

Referring now to FIG. 4, a flowchart setting forth the steps of an exemplary method for separating the relative signal contributions of different chemical species using information gained from considered MT saturation is provided. The following description of this process is provided with respect to a non-limiting example of R2* IDEAL imaging, which estimates fat, water, field map, and R2* maps from three or more echo-time images from multi-echo SPGR scans. However, one of ordinary skill in the art will readily understand that the method is not limited to this particular implementation and can readily be extended to other CSI methods that use SPGR or other pulse sequences including spin echo (SE) and balanced stead state free precession (bSSFP) sequences.

Figure 5:
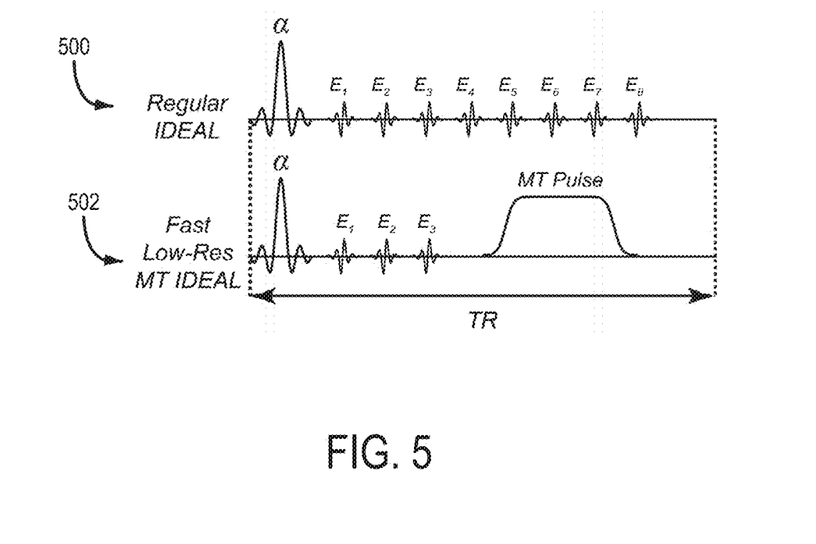
FIG. 5 is a pulse sequence diagram in accordance with the present disclosure.

The method begins of FIG. 4 at process block 402 with the acquisition of two datasets. A first data set is acquired using MT saturation and another is acquired without MT saturation. In particular, FIG. 5 illustrates a pulse sequence for acquiring the datasets at process block 402. In particular, a first pulse sequence 500 is performed, such as described above with respect to FIG. 2. In the simplified illustration of the first pulse sequence 500 of FIG. 5, an excitation pulse (α) is used to acquire a series of echoes ($E_1$-$E_8$). For example, the first pulse sequence 500 may be used to acquire a standard IDEAL dataset with multiple echo times. In addition, a second pulse sequence 502 is performed, which includes an excitation pulse (α) used to acquire a few echoes ($E_1$-$E_3$) and includes an MT pulse. This second pulse sequence 502 may be a low-resolution IDEAL dataset with MT pulse. To facilitate the subtraction that will follow, the echo times may be generally maintained. To this end, the MT pulse may be designed to replace echoes of the first pulse sequence 500. In the illustrated, non-limiting example, the MT pulse replaces acquisition of echoes $E_4$-$E_8$. As a result of acquiring a reduced number of echoes ($E_1$-$E_3$ in this non-limiting example), the second pulse sequence 502 yields a lower-resolution dataset than the first pulse sequence 500, but the echo time (TE) is the same. Alternatively, echoes $E_4$-$E_8$ can be acquired using the second pulse sequence 502 and the RF excitation pulse, α, can be adjusted, such as by adjusting a width, to allow the desired subtraction. In any case, referring again to FIG. 4, at process block 402, a first CSI dataset is acquired without eliciting MT and a second CSI dataset is acquired that includes use of MT.

As MRI signal from bound (macromolecules) is not detectable and there are no MT exchange mechanisms between fat and the water and macromolecular tissue components, as described above, the signal from a voxel for multi-echo SPGR sequence can be written as a linear combination of water and fat components $$s_n = \left(a_{mt}\rho_W + \rho_F \sum_{m=1}^{M} \alpha_m e^{i2\pi f_m t_n}\right) e^{-R_2^* t_n} e^{i2\pi f_B t_n}, \quad (15)$$

where, coefficient $a_{mt}$ represents attenuation of water signal due to MT effect ($a_{mt} \leq 1$). As will be described, the present disclosures allows one to create a field map from which to determine the magnetic field, which increases accuracy for a number of reasons. For example, isolating signal from water only instead of fat and water together includes signal from a broader range of tissues because the field map spans most tissues, as opposed to being limited to only tissues that include both fat and water. The signal is acquired at several echo times, $t_n$, and the model in equation (15) is used to fit the images at different echo times to yield the parameters of interests.

To this end, at process block 404, the acquired datasets are used to generate MT-weighted maps. More particularly, the first and second datasets are subtracted to yield MT-weighted water maps at several echo times. This subtraction may be a complex subtraction to include both magnitude and phase information in the subtraction.

That is, the selective sensitivity of tissue water to off-resonance saturation can be used in a number of variants to improve separation of chemically shifted species such as fat and water. One non-limiting relies on identification of water signal for field map calibration by complex valued subtraction of specially acquired images. Assume that MR images $s_n^{(off)}$, $s_n^{(on)}$ are acquired without ($a_{mt}=1$) and with ($a_{mt}<1$) MT saturation, respectively, at process block 402, while the remaining pulse sequence parameters between the two pulse sequences of FIG. 5 remain the same (e.g., repetition time TR, excitation flip angle, echo times, etc.). Then, the complex-valued subtraction of the images corresponding images at $n^{th}$ echo time $t_n$ creates MT-attenuated images without fat signal, given by:

$$s_n^{(mt)} = s_n^{(off)} - s_n^{(on)} = (1-a_{mt})\rho_W e^{-R_2^* t_n} e^{i2\pi f_B t_n} \quad (16).$$

By doing so, fat signal is eliminated. Then, at process block 406, the complex-valued water maps process block 404 can be used to find phase differences between echoes i and j:

$$\phi_{kl} = \angle[s_k^{(mt)} \text{conj}(s_l^{(mt)})] \quad (17).$$

That is, with the fat signal removed, the field map can now be robustly calculated in MT-attenuated tissues using standard phase difference methods and approximated in the whole object using interpolation-based estimation.

At process block 408, the phase difference determined at process block 406 can be used to obtain unwrapped, interpolated, and/or smooth phase differences. Compensation can be performed in a variety of ways. For example, interpolation-based refinement can be implemented as a moving local 2D quadratic fit weighted by MT-attenuated image serving as a measure of confidence of the input values. More particularly, a phase difference estimate $\tilde{\phi}_{kl}(r_0)$ can be found using a local polynomial fit to points within radius $\Delta r \leq r_{max}$ around spatial location $r_0$ (shown on example of quadratic fit), such as provided in equation 16:

$$[a, b, c] = \quad (18)$$
$$\min_{a,b,c} \sum_{\Delta r \leq r_{max}} |||s_1^{(mt)}(r_0 + \Delta r)|[\phi_{kl}(r_0 + \Delta r) - a\Delta r^2 - b\Delta r - c]||_2^2$$

$$\tilde{\phi}_{kl}(r_0) = c$$

Thus, at process block 410, a corrected or calibrated magnetic field map can be generated. At process block 412, calibrated field map values can be applied to demodulate data from magnetic field contribution. Based thereon, at process block 414, a CSI reconstruction method, such as IDEAL, can be used to create images using the corrected data.

Example

Experiments were performed on a 3.0T GE MR750 (Waukesha, Wis.). A full-resolution IDEAL scan was followed by low-resolution MT-IDEAL scan in which an MT pulse was positioned in place of later echoes to maintain same TR (=23 ms), such as illustrated in FIG. 5, whereby (IDEAL: TE=[1.5 3.3 5.0 6.7 8.4 10.2 11.9 13.6] ms, 192×160 matrix; MT-IDEAL: TE=[1.5 3.3 5.0] ms, 8-ms 600 dgr Fermi-shaped MT pulse, $\Delta$=3 kHz, 192×16 matrix). All field maps were used to initialize both standard (non-regularized) IDEAL1 and IDEAL with field map smoothness regularization.

The above-described systems and methods were shown to improve robustness of CSI using the example of IDEAL. It was achieved by enabling field map pre-estimation without fat interference. In scenarios with moderate inhomogeneity, the approach improved F/W separation even without computationally demanding field map smoothness regularization. As MT-based field map initialization facilitates convergence to the correct minima of the objective function, it can improve F/W estimation even in suboptimal imaging conditions, such as significant field inhomogeneities and non-uniform/non-optimized echo spacing.

Figure 6A:
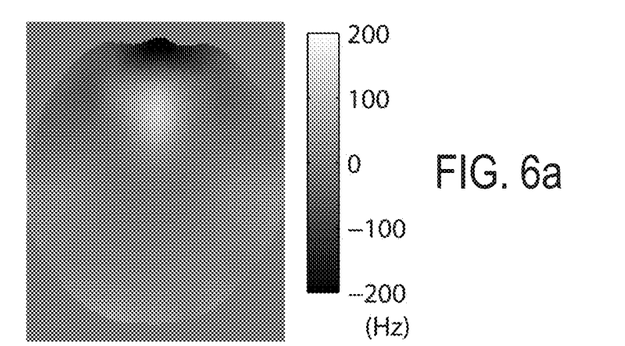
FIG. 6a is an example image showing MT-based field map estimate.
Figure 6B:
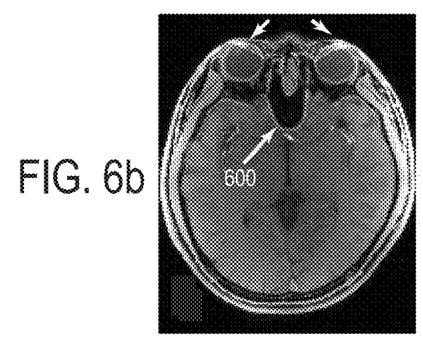
FIG. 6b is an example image showing water components form a standard IDEAL imaging process.
Figure 6C:
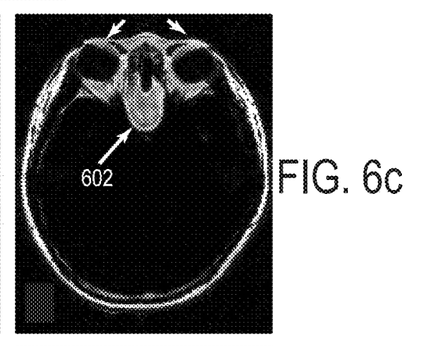
FIG. 6c is an example image showing fat components form a standard IDEAL imaging process.
Figure 6D:
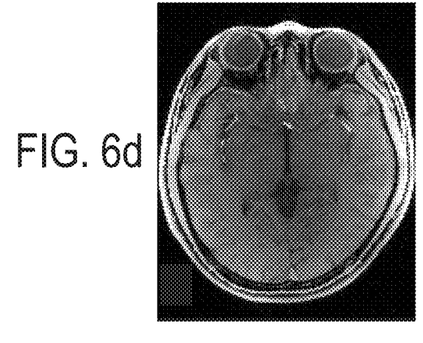
FIG. 6d is an example image showing water components form an IDEAL imaging process using an MT-based field map.
Figure 6E:
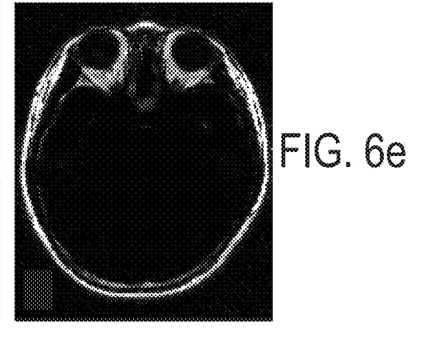
FIG. 6e is an example image showing fat components form an IDEAL imaging process using an MT-based field map.

This is illustrated in FIGS. 6a-6e, the effect of the MT-based field map prior is shown on performance of non-regularized IDEAL in brain in FIG. 6a. Water and fat components from standard IDEAL are shown in FIGS. 6b and 6c, respectively, which shows swaps and errors 600, 602. IDEAL initialized using the above-described MT-based field map correctly produces improved water/fat separation, as illustrated in FIGS. 6d and 6e.

The above-described approach causes only a moderate scan time increase, for example, ~10%. This overhead may be reduced in parallel imaging protocols, such as GRAPPA, to 5% and 2.5% for 2× and 4× accelerations, correspondingly, if the extra MT-IDEAL scan is utilized for GRAPPA calibration thereby avoiding acquisition of fully sampled k-space center of IDEAL dataset.

The above-described systems and methods leverage the existence of MT-sensitive tissues, which are naturally abundant in human body (e.g. brain, muscles, collagen-containing tissues, liver). Interpolation/smoothing processing yields a field map estimate in MT-insensitive tissues (fat, fluids) sufficiently accurate for efficient initialization of IDEAL algorithms. Alternatively, the MT-based field map prior can be incorporated into a probabilistic IDEAL framework or can be used for initialization of seed areas in region growing algorithms to improve their performance in disconnected tissue areas, such as tissue-air interfaces or surrounding implants. In case of fat/water/T2* imaging, the field map may be preferable with T2* from MT-calibrated echoes.

Thus, a system and method is provided that yields improved separation of fat and water components in various anatomies, increased accuracy of fat fraction and iron overload quantification due to reduction of fat/water separation errors, improved fat/water imaging for very strong $B_0$ inhomogeneities such as in near-metal imaging, and much faster calculation times than traditional methods for addressing $B_0$ inhomogeneities in CSI.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a map of a static magnetic field ($B_0$) of a magnetic resonance imaging system, the method comprising:
   a) forming a first dataset by acquiring, with the MRI system, a first plurality of different echo signals occurring at a respective plurality of different echo times;
   b) forming a second dataset by acquiring, with the MRI system, a second plurality of different echo signals occurring at a respective plurality of different echo times, wherein the second dataset includes signals resulting from a magnetization transfer (MT) between free water and bound molecules;
   c) generating MT-weighted maps using the first dataset and the second dataset;
   d) determining, using the MT-weighted maps, a phase difference between the first plurality of different echo signals; and
   e) using the phase differences, generate a corrected map of the static magnetic field ($B_0$) of the MRI system.

2. The method of claim 1 further comprising, using the phase difference, generating chemical shift images corrected for inhomogeneities in the static magnetic field ($B_0$) of the MRI system.

3. The method of claim 2 wherein the chemical shift images are formed using a Dixon-based fat-water separation.

4. The method of claim 2 wherein the chemical shift images are formed using an iterative decomposition of water and fat with echo asymmetry and least-squares (IDEAL) process.

5. The method of claim 1 wherein step e) includes performing one of a region-growing process or a smoothness or linear assumption process.

6. The method of claim 1 wherein step b) includes performing, with the MRI system, one of an off-resonance MT pulse or a radio-frequency (RF) pulse designed to induce an MT effect.

7. The method of claim 1 wherein steps a) and b) include performing a pulse sequence to perform a Dixon-based fat-water separation.

8. The method of claim 7 wherein the pulse sequence includes at least one of spoiled gradient recalled echo (SPGR) pulse sequence, fast spin echo (FSE) pulse sequence, gradient-recalled echo (GRE) pulse sequence, and a balanced steady state free precession (bSSFP) pulse sequence.

9. The method of claim 1 further comprising, using the phase difference, generating chemical shift images in which the plurality of different chemical species are delineated that comprise water and fat.

10. A magnetic resonance imaging (MRI) system, comprising:
    a magnet system configured to generate a static magnetic field about at least a portion of a subject arranged in the MRI system;
    a gradient system configured to establish at least one magnetic gradient field with respect to the static magnetic field;
    a radio frequency (RF) system configured to deliver excitation pulses to the subject and acquire imaging data from the subject;

a computer system programmed to:
control the gradient system and RF system to perform a first pulse sequence to acquire a first plurality of different echo signals occurring at a respective plurality of different echo times and form therefrom a first dataset at a first resolution;
control the gradient system and RF system to perform a second pulse sequence, different from the first pulse sequence and including a magnetization transfer (MT) pulse, to acquire a second plurality of different echo signals occurring at a respective plurality of different echo times and form therefrom a second dataset at a second resolution;
using the first dataset and the second dataset, determine a MT-weighted water map at a selected one or more of the plurality of different echo times;
using the MT-weighted water map, determine phase differences between echoes;
using the determined phase differences, determine compensations to offset the phase differences;
correct at least one of the first dataset or the second dataset using the compensations to generate at least one corrected dataset; and
generate images of the subject using the at least one corrected dataset.

11. The MRI system of claim 10 wherein the computer system is further programmed to use the phase differences to generate a map of the static magnetic field ($B_0$) of the MRI system.

12. The MRI system of claim 11 wherein the images include chemical shift images corrected for inhomogeneities in the static magnetic field ($B_0$) of the MRI system.

13. The MRI system of claim 10 wherein the images are formed using a Dixon-based fat-water separation.

14. The MRI system of claim 10 wherein the images are formed using an iterative decomposition of water and fat with echo asymmetry and least-squares (IDEAL) process.

15. The MRI system of claim 10 wherein the second pulse sequence includes one of an off-resonance MT pulse or a radio-frequency (RF) pulse designed to induce an MT effect.

16. The MRI system of claim 10 wherein the computer system is further programmed to use the phase difference to generate chemical shift images in which a plurality of different chemical species are delineated that comprise water and fat.

17. A method for acquiring medical images of a subject using a magnetic resonance imaging (MRI) system having a static magnetic field ($B_0$), the method comprising:
performing a first pulse sequence to acquire a first plurality of different echo signals from the subject occurring at a respective plurality of different echo times and form therefrom a first dataset at a first resolution;
performing a second pulse sequence, different from the first pulse sequence and including a magnetization transfer (MT) pulse, to acquire a second plurality of different echo signals occurring at a respective plurality of different echo times and form therefrom a second dataset at a second resolution that is lower than the first resolution;
using the first dataset and the second dataset, determining a MT-weighted water map at a selected one or more of the plurality of different echo times;
generating a map of the static magnetic field ($B_0$) of the MRI system using the MT-weighted water map; and
generating chemical-shift imaging (CSI) images from at least one of the first dataset or the second dataset using the map of the static magnetic field ($B_0$).

18. The method of claim 17 wherein determining the MT-weighted water map includes subtracting the first dataset and the second dataset using a complex subtraction.

19. The method of claim 17 wherein the echo time (TE) of the first pulse sequence and the second pulse sequence are matched.

20. The method of claim 17 wherein generating the map of the static magnetic field ($B_0$) includes performing one of region-growing process or a smoothness or linear assumption process.

21. The method of claim 17 further comprising incorporating the map into one of a probabilistic iterative decomposition of water and fat with echo asymmetry and least-squares (IDEAL) framework or a region growing algorithm as a seed.

* * * * *

UNITED STATES PATENT AND TRADEMARK OFFICE
CERTIFICATE OF CORRECTION

PATENT NO.        : 10,042,025 B2
APPLICATION NO.   : 15/172122
DATED             : August 7, 2018
INVENTOR(S)       : Alexey A. Samsonov Page 1 of 1

It is certified that error appears in the above-identified patent and that said Letters Patent is hereby corrected as shown below:

In the Specification

Column 7, Line 4, "I-coupling" should be --J-coupling--.

Signed and Sealed this
Second Day of October, 2018

Andrei Iancu
*Director of the United States Patent and Trademark Office*